(12) United States Patent
Bush et al.

(10) Patent No.: US 6,606,330 B2
(45) Date of Patent: Aug. 12, 2003

(54) LASER DRIVE COMPENSATION BY DUTY CYCLE AND POWER

(75) Inventors: Craig Palmer Bush, Lexington, KY (US); Mark Edwin Kirtley Lund, Lexington, KY (US); Eric Wayne Westerfield, Versailles, KY (US)

(73) Assignee: Lexmark International, Inc., Lexington, KY (US)

( * ) Notice: Subject to any disclaimer, the term of this patent is extended or adjusted under 35 U.S.C. 154(b) by 136 days.

(21) Appl. No.: 09/850,491

(22) Filed: May 7, 2001

(65) Prior Publication Data

US 2002/0163944 A1 Nov. 7, 2002

(51) Int. Cl.$^7$ .................................. H01S 3/13
(52) U.S. Cl. ............... 372/29.021; 372/29.02; 372/38.02; 372/38.06
(58) Field of Search ............... 372/29.021, 29.02, 372/38.02, 38.06

(56) References Cited

U.S. PATENT DOCUMENTS

| | | |
|---|---|---|
| 4,625,315 A | 11/1986 | Lemberger et al. |
| 4,713,672 A | 12/1987 | Horihata et al. |
| 4,734,714 A | 3/1988 | Takasu et al. |
| 4,751,524 A | 6/1988 | Balchunas |
| 4,885,597 A | 12/1989 | Tschang et al. |
| 4,972,210 A | 11/1990 | Woo |
| 4,995,045 A | 2/1991 | Burley et al. |
| 5,123,023 A | 6/1992 | Santarelli et al. |
| 5,126,759 A | 6/1992 | Small et al. |
| 5,151,909 A * | 9/1992 | Davenport et al. ........... 372/22 |
| 5,159,357 A | 10/1992 | Ng et al. |
| 5,170,403 A | 12/1992 | Mayer |
| 5,212,501 A | 5/1993 | Nakamura et al. |
| 5,220,348 A | 6/1993 | D'Aurelio |
| 5,253,934 A | 10/1993 | Potucek et al. |
| 5,257,035 A | 10/1993 | Funahashi et al. |
| 5,258,780 A * | 11/1993 | Ema et al. ................... 347/131 |
| 5,264,868 A | 11/1993 | Hadley et al. |
| 5,335,239 A | 8/1994 | Her zeg et al. |
| 5,389,953 A | 2/1995 | Agar et al. |
| 5,467,363 A | 11/1995 | Okabayashi |
| 5,512,932 A * | 4/1996 | Rolfe .......................... 347/247 |
| 5,583,644 A | 12/1996 | Sasanuma et al. |
| 5,631,746 A | 5/1997 | Overall et al. |
| 5,724,088 A | 3/1998 | Genovese |
| 5,729,270 A | 3/1998 | Wright et al. |
| 5,774,165 A | 6/1998 | Nakajima et al. |
| 5,912,694 A | 6/1999 | Miyake et al. |
| 5,917,534 A | 6/1999 | Rajeswaran |
| 5,949,963 A | 9/1999 | Hirata et al. |
| 5,966,394 A | 10/1999 | Spurr et al. |
| 6,014,161 A | 1/2000 | Hirst et al. |
| 6,043,835 A | 3/2000 | Au Yeung et al. |
| 6,069,645 A | 5/2000 | Vincent |
| 6,072,511 A | 6/2000 | Mueller et al. |
| 6,370,175 B1 * | 4/2002 | Ikeda et al. ................ 372/38.1 |

* cited by examiner

Primary Examiner—Eddie Lee
Assistant Examiner—Matthew E. Warren
(74) Attorney, Agent, or Firm—John A. Brady

(57) ABSTRACT

Laser printers are designed assuming the actual laser operates at nominal values which are the average or central values of a large batch of such lasers. The nominal values are determined and stored in permanent memory. Similarly, the values of the laser actually in the printer are determined during manufacture and also stored in permanent memory. Data to the laser is adjusted to correlate the output called for by the data with the differences in response of the laser of the printer by determining the optical output called for by the data using the nominal values stored and then finding the power needed to achieve the same output using the actual values stored. This is particularly useful with extreme duty cycles.

4 Claims, 1 Drawing Sheet

LASER DRIVE COMPENSATION BY DUTY CYCLE AND POWER

TECHNICAL FIELD

This invention relates to the driving of lasers at various currents to select optical power output and at high speeds characteristic of high-resolution laser printing.

BACKGROUND OF THE INVENTION

Standard lasers have a diode mounted behind the light source, known as a PIN diode, which receives a small, fixed proportion of the light energy of the laser, and it is widely practiced to calibrate lasers by adjusting current to the laser in response to the output of the PIN diode. Such systems typically are for duty cycles (on to off reversals) which are not so fast as to be significant to laser operation. Representative prior disclosures of such systems are the following U.S. Patents: U.S. Pat. No. 5,467,363 to Okabayashi, U.S. Pat. No. 6,014,161 to Hirst et al., U.S. Pat. No. 6,043,835 to AuYeung, and U.S. Pat. No. 6,069,645 to Vincent.

For certain operations, particularly high-resolution laser printers, known prior calibrations are unsatisfactory. A high-quality printer operating at resolution of 1200 dots per inch data might operate the laser at four times that dots resolution, or 4800 time slices per inch (each operation or non-operation being termed a slice). Representative printers operating in slices are disclosed in U.S. Pat. No. 5,631,746 to Overall et al and U.S. Pat. No. 5,729,270 to Wright et al.

Variation from the desired level of optical output has a direct impact on print quality and also print consistency from machine to machine. Variation in any of the system components such as the source of the laser on/off (duty cycle) signal, any passive components on the on/off signal, cabling (if any) and the laser diode itself can have a significant influence on the actual laser light energy produced, especially if the laser on/off signal is modulated quickly enough that edges occur within 10 ns of each other. The laser energy output could be more tightly controlled in an open-loop manner in a variety of ways such as tightening component tolerances, slowing down the modulation rate of the on/off signal, eliminating the cable required to take the on/off signal from its source to the laser diode driver or by using fiber-optic or differential drivers on the on/off signal. However, laser printers are generally cost-sensitive and these other solutions can be costly and only serve to minimize variation by controlling the input to the laser diode driver rather than by sampling the actual energy output level and adjusting the system accordingly.

In accordance with this invention calibration extends to the differences experienced at different duty cycles and through a range of currents driving the laser at those duty cycles. Moreover, this invention employs a realization that at lower speeds, variations from the PIN diode between a batch of lasers manufactured to be the same, are variations of the PIN diode system and not of the optical output. The output of such lasers is substantially identical, and the calibration of this invention adjusts for that.

DISCLOSURE OF THE INVENTION

Printers are necessarily designed assuming a given laser operation. This is termed the nominal laser operation, and specified nominal values are the average or central values of those specified by the manufacturer. In accordance with this invention the values of a nominal laser are determined by observation of a representative batch of lasers at operations between a low current (such as 25 percent of maximum specified) and a high value (such as 85 percent of maximum of specified). This is observed at the lowest duty cycle employed by the printer (such as one 4800 slice per inch), and at the higher duty cycles (such as two adjoining of the 4800 slices, which is a duty cycle of power-on for $\frac{1}{2400}$ inch; also three adjoining of the 4800 slices; and finally four adjoining of the 4800 slices). Additionally, the PIN diode value of the nominal printer is measured while driving the printer at 100% duty cycle at medium power.

At manufacture of a printer, these same values are measured for just the actual laser of that printer. During printing the output is adjusted by determining the PIN value of the nominal printer for each slice to be printed, adjusting that value to reflect the PIN value of the laser of the printer, and then determining the slice and current in the printer to produce that adjusted PIN value from the laser. (As a printer may only print by regular slices, the slices may be more or less than the data for the nominal printer specifies, with the drive current being proportionally lower or higher.)

BRIEF DESCRIPTION OF THE DRAWINGS

The details of this invention will be described in connection with the accompanying drawings, in which.

DESCRIPTION OF EMBODIMENTS

The response of lasers to changes in drive current is linear, and at given duty cycles these changes can be considered linear, as the differences of current at different frequencies affect the slope rather than the linearity of the response. Accordingly, in the embodiments to be described, only two measurements are made for each duty cycle, one at 25 percent of maximum power and one at 85 percent of maximum power. The quantity measured is the analogue output of the PIN diode. Measurements for a nominal printer are shown in FIG. 1.

Figure 1:
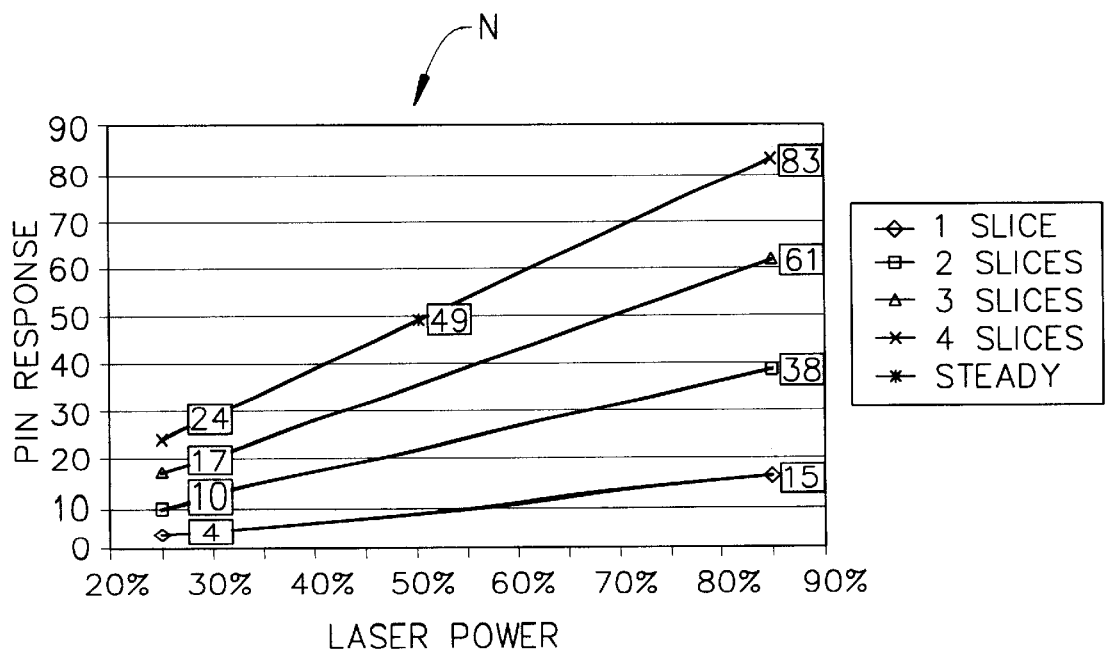
FIG. 1 is a graphical illustration of the nominal data employed in this invention and FIG. 2 is a graphical illustration of the unique data of the printer employed in this invention. In both the horizontal axis is power (current) to the laser in percent of maximum while the vertical axis is optical power measured by the PIN in arbitrary linear units.

In addition to the points measured, FIG. 1 shows the linear line connecting these points as that line is interpreted as the output between the measured points. In FIG. 1 the four duty cycles are $\frac{1}{4800}$ inch on/off, $\frac{1}{2400}$ inch on/off, $\frac{1}{1600}$ inch on/off, and continuously on. These duty cycles result from a 1200 dots per inch resolution printer printing in 4 equal slices per dot (the slices being selected to control overall darkness and to smooth edges of printed characters and symbols). The actual on-to-off time for each duty cycle varies with the laser scan rate of the printer, but at extreme low duty cycles (i.e., short on times) typically the laser output is disproportionally low and at extreme high duty cycles (i.e., long on times) typically the laser output is disproportionally high.

The printer is, of course, an electronic printer controlled by a data processor or comparable electronic logic. The foregoing eight values are stored in memory of all printers. An additional value is measured and so stored. That value is PIN output of the nominal laser at a predetermined steady state or long duty cycle output at a predetermined intermediate current.

Figure 2:
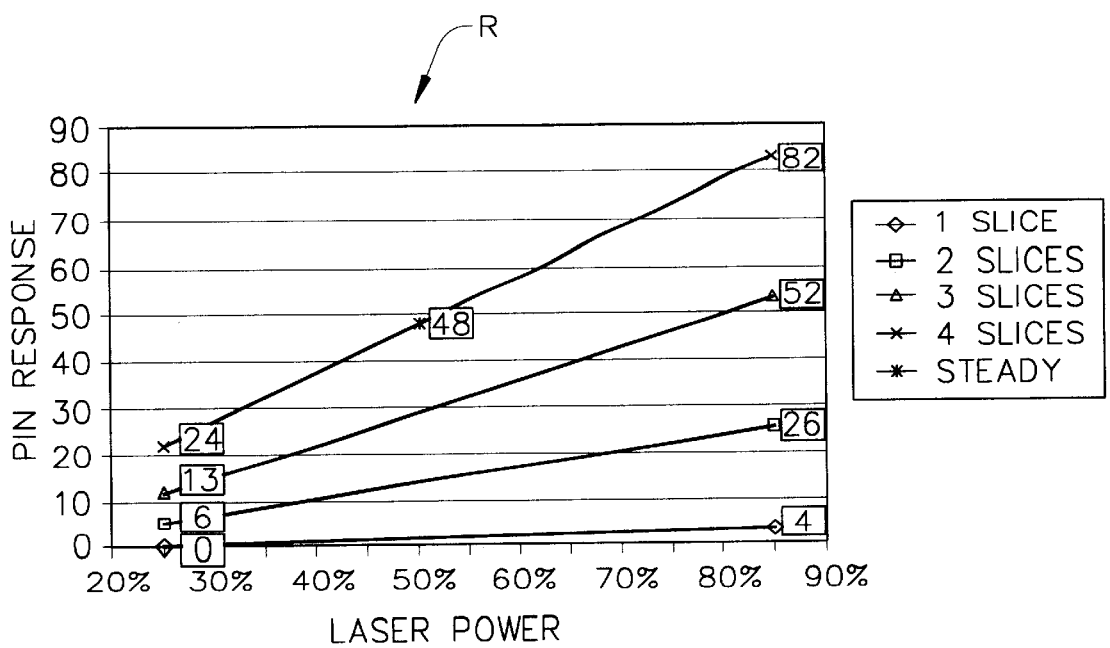

All nine of the values corresponding to those measured of the nominal printer are measured for each printer as part of the final manufacture of that printer. FIG. 2 shows these results for an illustrative printer. The same four lines and one steady state value appears, but the locations and slopes of the four lines differ from those of the FIG. 1 nominal figures and the steady state value also differs. With respect to the steady state value, the commercially available lasers are calibrated by driving them, for example at steady state and 50 percent laser power input, with the laser output sensed using an external sensor. The laser power output is adjusted to a reference value using a potentiometer. The potentiometer setting remains through the life of the laser application. After such calibration, differences in the PIN outputs are differences in the PIN system such as in power supply voltage and feedback circuit tolerances.

The data illustrated by FIG. 2 is then stored in the non-volatile memory (such a NVRAM) of the printer. The data could also be stored in alternate forms such a point-slope, but the linear nature of the data makes storing the endpoints the most compact way to store the data because non-integer slopes would require multiple bytes for storage. This data, along with the corresponding nominal data discussed above, are that needed for the data processor to determine how much to alter the standard laser power and laser duty cycle setting at a particular print setting in order to make its laser energy output match that of a nominal machine.

As is previously employed in commercial printers, the image processor (typically termed a raster image processor or RIP), produces a signal for each dot location of slices to be printed. In this description the printer is assumed to be printing in 1200 dots per inch and the number of slices are 4 per dot. Rather than printing those slices at the predetermined laser power as in the past, that pattern of slices is operated on in accordance with this invention and then printed. Typically only the laser driving power is modified in response to the pattern, while the number and location of slices is left unchanged. However, as illustrated by the example, the number of slices may be changed to achieve the appropriate calibration.

The values of FIG. 1 will be termed N values, for nominal. The values of FIG. 2 will be termed R values for random production. The PIN values may be in arbitrary units so long as they are linear with the change in output of the PIN and are the same units for all machines. The information in parentheses in the following text after either N or R indicates the values on the figures; PIN meaning measured optical values by the PIN and appearing on the vertical scale; power meaning input current to the laser and appearing on the horizontal scale; and low, high and RIP meaning, respectively, the low value of the scale, the high value on the scale, and the value corresponding to the input drive data from the RIP.

In this illustration it is assumed that the RIP calls for two adjoining slices at 80.1 percent of laser power. Referring to FIG. 1, the two-slice curve has N(PIN low) of 10 and N(PIN high) of 38, their difference being 28. The difference between N(power low) of 25 and N(power high) of 85 is, of course, 60. The slope of the two-slice curve is therefore 28/60 (i.e., N(PIN high)) minus N(PIN low) divided by N(power high) minus N(power low) by elementary definition of a linear line. The N(PIN low) value, 10, is a vertical intercept (typically termed a y intercept). The vertical change from the y intercept is slope times horizontal distance from the y intercept, specifically 28/60 times (80.1−25) (i.e., slope times N(power from RIP) minus N(power low)), which is 25.7. Accordingly, N(PIN RIP) is 25.7 plus 10 (i.e., the vertical change plus the y intercept), which is 35.7.

To achieve this optical output from R, the actual optical source, which has the characteristics in FIG. 2, the 35.7 amount is first adjusted by a ratio of R(PIN steady) divided by N(PIN steady)or 48/49, to thereby recognize that the light output from R is proportionally higher than recognized by the PIN measurements of R. Accordingly, the desired R (PIN RIP) is 48/49 times 35.7 (i.e., R(PIN steady divided by N(PIN steady) times N(PIN RIP), which is 35.0.

The 2 slice R line is first examined for producing an R(PIN) of 35.0. Since the maximum value of that line is 26, the next more powerful line is examined, the 3 slice line. The R 3 slice line does encompass 35.0 PIN. Accordingly that line is solved for power, by computation for a straight line. The slope is 52−13 divided by 60 (i.e., R(PIN high)) minus R(PIN low) divided by R(power high) minus R(power low), which is 39/60. The horizontal intercept (termed x intercept) is 25 and the unknown is R(power RIP). Accordingly, the horizontal change from the x intercept is 60/39 times R(PIN RIP)minus 13 (the horizontal intercept or 60/39 times (35−13), which is 33.8. Accordingly, R (power RIP) is 33.8 plus 25 (i.e., the horizontal change plus the x intercept), which is 58.8.

Where the pertinent differences between the N and the R characteristics are small enough to permit the printing to employ the same number of slices, that more closely follows the desired pattern and should be used. But where necessary, printing a different number of slices results in the light energy being as called for by the RIP, which assures a satisfactory image and should be employed.

The foregoing or equivalent computations are made by electronic data processing apparatus, such as done in real time by a microcomputer or equivalent logic circuit. Thus, as printing resolution and darkness are specified for a job, the foregoing adjustments are determined and transmitted to the optical driver to thereby drive the laser according to the foregoing adjustments until a change in those specifications.

Depending on tolerance variation, adjusting for the steady state variations may be unnecessary or insignificant, and the PIN results from the N lines would be used unchanged to find the power from the R lines.

Although the general linearity of the responses permits simple, first power computations, the same computations of first N(PIN) and, from N(PIN) optionally modified by the steady state differences, finding R(power RIP) could be employed for curved lines using standard algebra. Other modification can be anticipated.

What is claimed is:

1. The method of driving an actual optical source from drive power data suitable for an optical source having nominal optical energy outputs at a range of power inputs at at least two duty cycles comprising the steps of:

storing first information defining said nominal optical energy outputs for a first duty cycle and for at least a second duty cycle, determining from said first information the optical energy output for individual power input levels of said drive data, storing second information defining the optical energy outputs at a range of power inputs of said actual optical source for a first duty cycle and for at least a second duty cycle, determining from said second information the power input to said actual optical source to at least approximate said optical energy output determined from said first information, and driving said actual optical source at said determined power input in a selected duty cycle.

2. The method as in claim 1 also comprising the step of adjusting said determined optical energy output by a ratio corresponding to differences in sensing of optical energy output of said actual power source and the optical energy output of said optical source having nominal optical energy outputs.

3. The method as in claim 1 in which said nominal optical energy outputs are stored as linear characteristics and said information defining the optical energy outputs of said actual optical source are stored as linear characteristics.

4. The method as in claim 2 in which said nominal optical energy outputs are stored as linear characteristics and said information defining the optical energy outputs of said actual optical source are stored as linear characteristics.

* * * * *